United States Patent [19]
White

[11] Patent Number: 5,339,263
[45] Date of Patent: Aug. 16, 1994

[54] COMBINED DECIMATION/INTERPOLATION FILTER FOR ADC AND DAC

[75] Inventor: Stanley A. White, San Clemente, Calif.

[73] Assignee: Rockwell International Corporation, Seal Beach, Calif.

[21] Appl. No.: 10,093

[22] Filed: Jan. 28, 1993

[51] Int. Cl.$^5$ .............................................. G06F 15/31
[52] U.S. Cl. ............................ 364/724.1; 364/724.01
[58] Field of Search ................. 364/724.01, 724.10, 364/724.13, 728.01; 341/77

[56] References Cited

U.S. PATENT DOCUMENTS 4,601,005  7/1986  Kilvington ..................... 364/728.01
4,893,265  1/1990  Hirosaki ......................... 364/724.1
5,033,018  7/1991  Adcock ......................... 364/724.01

OTHER PUBLICATIONS

Primitive Operator Digital Filter Synthesis Using A Shift Biased Algorithm, D. R. Bull and D. H. Horrocks, IEEE 1988 Int. Sympos.
A Design Approach For A Decimation Filter, S. A. White Oct. 25–28, 1992 IEEE Conference.

*Primary Examiner*—Jerry Smith
*Assistant Examiner*—Emmanuel Moise
*Attorney, Agent, or Firm*—H. Fredrick Hamann; George A. Montanye; Tom Streeter

[57] ABSTRACT

A COMBINED DECIMATION/INTERPOLATION FILTER FOR ADC AND DAC (analog-to-digital converter and digital-to-analog converter) provides a single filter which may be used both as a decimation filter and as an interpolation filter. It is simple and inexpensive. It gains simplicity and inexpensivenes by carefully selecting the tap weights of the filter, cascading multiple filters, time domain multiplexing the multiple filters into a single filter, and using adders instead of multipliers to provide the tap weights.

8 Claims, 17 Drawing Sheets

```
1 0 0 1 1 1 1 0 1 0 1 1 1 0 0 1 0 1
1 0 1 0 0 0 -1 0 1 1 0 0 -1 0 0 1 0 1
1     15          1    7         5
```

INITIALIZE
P := 10                   NUMBER OF PASSES THROUGH THE DECIMATOR
R := 6                    RATIO OF SAMPLING FREQUENCY TO PASSBAND-EDGE
                          FREQUENCY OF THE FILTER
$A_{pb}$ := −120          PASSBAND PEAK RIPPLE SPEC IN dB
$A_{sb}$ := −120          STOPBAND PEAK RIPPLE SPEC IN dB $$O_0 := \text{CEIL}\left[ R \cdot \frac{A_{pb} + 13}{29.2 \cdot (4 - R)} + \frac{1}{4} \right]$$   ESTIMATED NUMBER OF MULTIPLIER COEFFICIENTS REQUIRED TO MEET THE PASSBAND SPEC.

$$O_1 := \text{CEIL}\left[ R \cdot \frac{A_{sb} + 7}{29.2 \cdot (4 - R)} + \frac{1}{4} \right]$$   ESTIMATED NUMBER OF MULTIPLIER COEFFICIENTS REQUIRED TO MEET THE STOPBAND SPEC.

N := MAX(O)     N = 12                   MINIMUM NUMBER OF MULTIPLIER COEFFICIENTS
m := 0..N       $\text{ZERO}_m$ := 0     REQUIRED TO MEET ALL SPEC. (MAY NEED 1 MORE.)

WRITEPREN (FB) := ZERO □             PRINTCOLWIDTH := 10     |12|

WRITEPREN (FB) := ZERO □             PRNPRECISION := 10    0 = |12|

WRITE (COUNT) := 0 □                 TYPE "PROCESS", COMMENT FA, FB, & COUNT, THEN
                                     GOTO 190.

FIG. 12a

SETUP

ITERATION := READ(COUNT)   ITERATION = 4   PBE = PASSBAND EDGE

WRITE(COUNT) := 1 + ITERATION   PBE := $(\overline{R})^{-1}$   PBE = 0.166666667

THE NUMBER OF BITS REQUIRED OF THE MULTIPLIER COEFFICIENTS TO GUARANTEE MEETING SPECS IS B WHERE:

B := 30 n := 0 .. N    n, p, AND r ARE INDICES. "N" IS RESERVED FOR COMPUTING THE FILTER PERFORMANCE ERROR OR RIPPLE; INDEX VALUES 0 THROUGH N−1 ARE FOR THE ACTUAL MULTIPLIER-COEFFICIENT INDICES. THE "PASSES" INDEX IS p, AND ACTUAL MULTIPLIER-COEFFICIENT INDEX IS q.

p := 0 .. P − 1 q := 0 .. N − 1

FA := READPRN(FA)   MEASURED PASSBAND EXTREMAL FREQUENCIES

FB := READPRN(FB)   MEASURED PASSBAND EXTREMAL FREQUENCIES

ITERATION := READ(COUNT)   ITERATION = 5

FIG. 12b $FPB_m := IF\left[ITERATION \quad 1, PBE \cdot \frac{m}{N}, FA_m\right]$    PASSBAND EXTREMAL FREQUENCIES USED IN CALCULATIONS.

$FSB_m := IF\left[ITERATION \quad 1, \frac{1}{2} - \left[1 - \frac{m}{N}\right] \cdot PBE, FB_m\right]$    STOPBAND EXTREMAL FREQUENCIES USED IN CALCULATIONS.

$M_{m,n} := IF\left[n \approx N, 2 \cdot (-1)^m, \sum_p 4 \cdot \cos\left[(2 \cdot n + 1) \cdot \frac{\pi}{p - \frac{1}{2}} \cdot FPB_m\right]\right]$    REMEZ MATRIX USED IN PASSBAND CALCULATIONS BASED ON A DOMINANT-TERM SERIES EXPANSION $r_m := P$    THE ALL-UNIT VECTOR SCALED BY "P".

$\alpha := M^{-1} \cdot r$    THE COEFFICIENT AND ERROR VECTOR.

$\delta := \alpha$    THE ERROR MEASURE.

$a_q := 2^{N-B} \cdot \left[FLOOR\left[.5 + 2^{B+1} \cdot \alpha_q\right]\right]$    FILTER COEFFICIENTS DOUBLED, THEN ROUNDED TO B BITS $C := 2^B \cdot (|a|)$    SCALED MAGNITUDES OF THE MULTIPLIER COEFFICIENTS FOR LATER USE.

$k := 256$    NUMBER OF POINTS FOR FREQUENCY ANALYSIS.

$k := 0 .. k - 1$    FREQUENCY-RESPONSE EVALUATION INDEX.

$FFPB_k := PBE \cdot \frac{k}{K-1}$    FREQUENCY VARIABLE FOR PASSBAND-PERFORMANCE EVALUATION.

$FFSB := \frac{1}{2} - FFPB$    FREQUENCY VARIABLES FOR STOPBAND-PERFORMANCE EVALUATION.

$FG := \frac{1}{2} \cdot \frac{FFPB}{PBE}$    FREQUENCY VARIABLE FOR TOTAL FILTER EVALUATION.

FIG. 12c

PASSBAND PERFORMANCE EVALUATION

THE EXACT EXPRESSION FOR THE PASSBAND ERROR IS:

$$EPB := 1 - \left[ \prod_p \left[ \left[\frac{1}{2}\right] \cdot \left[ 1 + \left[ \sum_q 2 \cdot a_q \cdot \cos\left[ (2 \cdot q + 1) \cdot \frac{\pi}{2^{p-1}} \cdot FFPB \right] \right] \right] \right] \right]$$

$EPB_K := EPB_{K-1}$    DEFINE AN ARTIFICIAL END POINT TO MAKE THE NOTATION WORK.

$XPB_{k+1} := IF\left[ EPB_{k+1} < EPB_k, \delta, -\delta \right]$    FILTER PERFORMANCE AND STOPBAND EXTREMAL-FREQUENCY MARKER.

NOW WE CAN ESTIMATE THE PASSBAND EXTREMAL FREQUENCIES $PB_{k+1} := IF\left[ XPB_{k+1} \approx -XPB_k, FFPB_k, PBE \right]$    EXTRACT N + 1 PASSBAND EXTREMAL-FREQUENCY ESTIMATES.

$SPB_m := (SORT(PB))_m$    THIS PUTS THE ESTIMATED PASSBAND EXTREMAL FREQUENCIES INTO MEMORY.

WRITEPRN(FA) := SPB $PBRIPPLE := 20 \cdot \log\left[ \max\left[ (|ESB|) \right] \right]$    COMPUTATION OF THE PEAK PASSBAND RIPPLE IN dB.

FIG. 12d

PASSBAND PERFORMANCE EVALUATION

THE EXACT EXPRESSION FOR THE STOPBAND ERROR IS:

$$ESB := -\left[\prod_p \left[\left[\frac{1}{2}\right] \cdot \left[1 + \left[\sum_q 2 \cdot a_q \cdot \cos\left[(2 \cdot q + 1) \cdot \frac{\pi}{2^{p-1}} \cdot FFPB\right]\right]\right]\right]\right]$$

$ESB_K := ESB_{K-1}$    DEFINE AN ARTIFICIAL END POINT TO MAKE THE NOTATION WORK.

$XSB_{k+1} := IF\left[ESB_k < ESB_{k+1}, -\delta, \delta\right]$    FILTER PERFORMANCE AND STOPBAND EXTREMAL-FREQUENCY MARKER.

NOW WE CAN ESTIMATE THE STOPBAND EXTREMAL FREQUENCIES $SB_{k+1} := IF\left[XSB_{k+1} \approx -XSB_k, FFSB_k, \frac{1}{2} - PBE\right]$    $SB_k := \frac{1}{2}$ $SORTSB_m := (-SORT(-SB))$    EXTRACT N + 1 STOPBAND EXTREMAL - FREQUENCY ESTIMATES AND SORT THEN IN ASCENDING ORDER.

$SSB := SORT(SORTSB)$
$WRITEPRM(FB) := SSB$    THIS PUTS THE ESTIMATED STOPBAND EXTREMAL FREQUENCIES INTO MEMORY.

$SBRIPPLE := 20 \cdot \log\left[\max\left[\left(|ESB|\right)\right]\right]$    COMPUTE THE PEAK STOPBAND RIPPLE IN dB.

FIG. 12e

SOME COMPUTATIONS ABOUT TOTAL FILTER DESIGN AND PERFORMANCE
... SATURATION INPUT LEVEL OF 1-BIT MODULATOR $X_{max} := 0.6$

COMPUTE THE CLASSIC SCALING NORMS:

$1_q := 1$ $L_1 := X_{max} \cdot \left[ 0.5 + \left[ \left( \sum_q |a| \right) \right] \cdot \frac{1}{4} \right]$ $L_\infty := X_{max} \cdot (0.5 + a \cdot 1)$

THE CASCADED DECIMATION FILTER OVERALL FREQUENCY RESPONSE IS GIVEN BY:

$$GPB := \left[ \left[ \prod_p \left[ \left[ \frac{1}{2} \right] \cdot \left[ 1 + \left[ \sum_q 2 \cdot a \cdot \cos \left[ (2 \cdot q + 1) \cdot \frac{\pi}{2^{p-1}} \cdot FG \right] \right] \right] \right] \right] \right]$$

FIG. 12f

ITERATION = 5

PBRIPPLE = −129.7

SBRIPPLE = −123.7

SPECS: $A_{pb} = -120$
$A_{sb} = -120$ $N = 12 \quad P = 10$
$B = 30 \quad R = 6$
$\delta = 0.000003182$
$L_1 = 0.9234343613$
$L_\infty = 0.5999999816$

TOTAL FREQUENCY RESPONSE OF FILTER

STOPBAND ERROR FREQUENCY RESPONSE

PASSBAND ERROR FREQUENCY RESPONSE

| DOUBLED, ROUNDED DECIMAL MULTIPLIER SCALING COEFFICIENTS. | MAGNITUDES OF THE MULTIPLIER SCALING COEFFICIENTS AS OCTAL NUMBERS. | PASSBAND EXTREMAL FREQUENCIES. | STOPBAND EXTREMAL FREQUENCIES |
|---|---|---|---|
| 0.6303047221 | 5025564636 0 | 0 | 0.333333 |
| −0.1939424193 | 1432306567 0 | 0.0183011 | 0.3335948 |
| 0.0990049566 | 6254143420 | 0.0366601 | 0.3411776 |
| −0.0552812126 | 3423350660 0 | 0.0549022 | 0.3516334 |
| 0.0307225734 | 1756557200 | 0.0725499 | 0.3516334 |
| −0.0162904393 | 1025634160 | 0.0895426 | 0.3653359 |
| 0.0080099674 | 4063607500 | 0.1065536 | 0.3755817 |
| −0.0035548676 | 1643706200 | 0.1222222 | |
| 0.0013780519 | 5511770 0 | 0.1366011 | 0.392281 |
| −0.0004439317 | 1642774 0 | 0.1483666 | 0.4124118 |
| 0.0001083482 | 3431620 | 0.1581720 | 0.4424484 |
| −0.0000157794 | 410570 | 0.1647706 | 0.4627455 |
| | | 0.1666667 | 0.4843140 |
| | | | 0.5 |
| a = | C = | SPB = | SSB = |

END OF PROGRAM

FIG. 12h

THE CASCADED DECIMATION FILTER OVERALL FREQUENCY RESPONSE IS GIVEN BY:

$$\text{GPB} := \left[\prod_p \left[\left[\frac{1}{2}\right] \cdot \left[1 + \left[\sum_q 2 \cdot a_q \cdot \cos\left[(2 \cdot q + 1) \cdot \frac{\pi}{2^{p-1}} \cdot FG\right]\right]\right]\right]\right]$$

FILTER PERFORMANCE SUMMARY

ITERATION = 5
PBRIPPLE = −129.7
SBRIPPLE = −123.7
SPECS: $A_{pb}$ = −120
$A_{sb}$ = −120

$N = 12 \quad P = 10$
$B = 30 \quad \text{TYPE} = 1$
$\delta = 0.0000003186$
$L_1 = 0.92342826150$
$L_\infty = 0.5999999804$

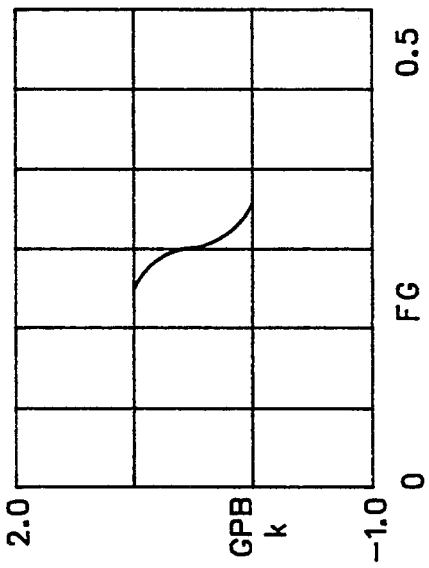

TOTAL FREQUENCY RESPONSE OF FILTER

FIG. 12i

| DOUBLED, ROUNDED DECIMAL MULTIPLIER SCALING COEFFICIENTS. | | MAGNITUDES OF THE MULTIPLIER SCALING COEFFICIENTS AS OCTAL NUMBERS. | | PASSBAND EXTREMAL FREQUENCIES | | STOPBAND EXTREMAL FREQUENCIES |
|---|---|---|---|---|---|---|
| 0.6303043254 | | 5025563764 0 | | 0 | | 0.333333 |
| -0.1939413119 | | 1432304322 0 | | 0.018301 | | 0.335948 |
| 0.0990033634 | | 6254110640 | | 0.036601 | | 0.341176 |
| -0.0552794309 | | 3423312750 | | 0.054902 | | 0.351634 |
| 0.0307208858 | | 1756522740 | | 0.072549 | | 0.365359 |
| -0.0162890468 | | 1025604660 | | 0.089542 | | 0.375817 |
| 0.0080008958 8 | | 4063400020 | | 0.106536 | | 0.392281 |
| -0.0035542324 | | 1643561000 | | 0.122222 | | 0.412418 |
| 0.0013777073 | | 5511206060 | | 0.135948 | | 0.427451 |
| -0.0004437778 | | 1642527 0 | | 0.148366 | | 0.442484 |
| 0.0001082942 | | 3430700 0 | | 0.158817 | | 0.462745 |
| -0.0000157682 | | 410430 | | 0.164706 | | 0.484314 |
| | | | | 0.166667 | | 0.5 |
| a = | | C = | | SPB = | | SSB = |

END OF PROGRAM

FIG. 12k

COMBINED DECIMATION/INTERPOLATION FILTER FOR ADC AND DAC

COPYRIGHT NOTICE

A portion of the disclosure of this patent document (FIGS. 12a-12e) contains material which is subject to copyright protection. The copyright owner has no objection to the facsimile reproduction by any one of the patent disclosure, as it appears in the Patent and Trademark Office patent files or records, but otherwise reserves all copyright rights whatsoever.

BACKGROUND OF THE INVENTION

This invention pertains to analog-to-digital converters (ADCs) and digital-to-analog converters (DACs), and has particular reference to digital filters which decimate the output of a sigma-delta ADC and to digital filters which interpolate the input to a sigma-delta DAC.

An analog signal may be converted to single-bit stream by means of a sigma-delta converter. This conversion generally takes place at very high frequencies (perhaps 8 megahertz), to avoid aliasing, even through the signal of interest to a downstream digital signal processor is at a much lower frequency (perhaps only 122 hertz). The bit stream must then be decimated, so as to gain precision in amplitude at the expense of frequency (which is tolerable, since the Nyquist frequency is also much lower than the sampling frequency), but such decimation must be done without itself introducing aliasing. Digital filters which do this are complex and expensive.

Likewise, a precise digital signal produced at a low frequency from a digital signal processor must be converted to a very high frequency single-bit stream before it may be converted to an analog signal by a sigma-delta converter. This requires that values be interpolated between the sparse Nyquist sampling points, again without introducing aliasing. Digital filters which do this are also complex and expensive.

SUMMARY OF THE INVENTION

The present invention provides a single filter which may be used both as a decimation filter and as an interpolation filter. It is simple and inexpensive. It gains simplicity and inexpensiveness by carefully selecting the tap weights of the filter, cascading multiple filters, time domain multiplexing the multiple filters into a single filter, and using adders instead of multipliers to provide the tap weights.

DETAILED DESCRIPTION OF THE DRAWINGS

Figure 1:
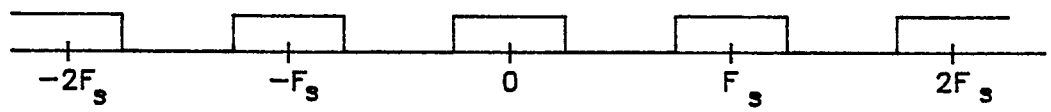
FIG. 1 shows the frequency response of the ideal half band low pass filter.
Figure 2:
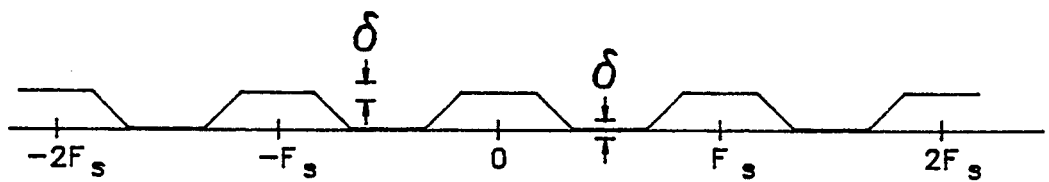
FIG. 2 shows the frequency response of a more realistic filter.

FIG. 1 shows the frequency response of the ideal half band low pass filter. Given a sampling frequency $F_s$, it has a perfectly flat pass band for $|f| < F_s/4$, a perfectly flat stop band for $F_s/4 < |f| < F_s/2$, and infinitely steep transitions at $|f| = F_s/4$. This perfect response is aliased at integral multiples of $F_s$. FIG. 2 shows a more realistic filter. The pass band extends only over $|f| < F_s/6$, a transition band extends fully over $F_s/6 < |f| < F_s/3$, the stop band extends only over $F_s/3 < |f| < F_s/2$, and an allowed ripple of delta is present in both the pass band and the stop band. The pass band, transition band, and stop band therefore each have the same width. Allowing such a wide transition band facilitates a reasonable delta with a reasonably simple filter. This facilitation is enhanced by allowing any reasonable response in the transition band; the smooth linear roll off shown in FIG. 2 is for conceptual purposes only and is not required in practice.

Suppose that the filter is applied to a signal contained in the pass band, and further suppose that this signal is sampled only half as frequently, i.e., at $F_s/2$ rather than $F_s$. This is the case in decimation. The signal will therefore be aliased at integral multiples of $F_s/2$ rather than of $F_s$. However, the aliased versions of the signal at odd multiples of $F_s/2$ will fall entirely in the stop bands, and only the signal aliased at even multiples of $F_s/2$ will be passed. If the sampling is again cut in half, this procedure may be repeated, and repeated again, until the ripple introduced by the filter becomes a problem.

Likewise, the sampling frequency may be doubled to $2F_s$, using zeroes to pad between actual data points. This is the case in interpolation. The signal will therefore be aliased at integral multiples of $2F_s$, where it will be passed. There will be no aliased versions of the signal at odd multiples of $F_s$. If the sampling is again doubled and zero padded, this procedure may be repeated, and repeated again, until the ripple introduced by the filter becomes a problem.

Figure 3:
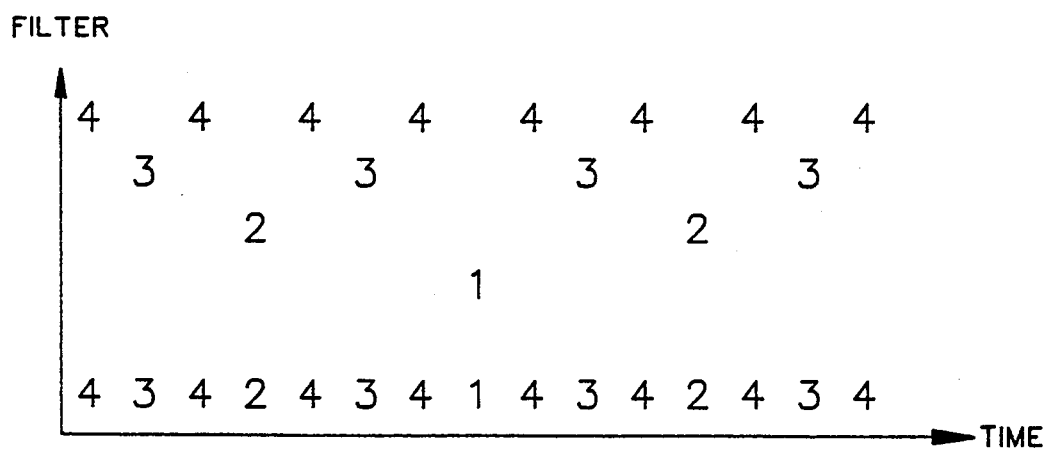
FIG. 3 shows the time domain multiplexing (TDM) alternative to the possible, but expensive, mechanization of physically cascading a plurality of filters end to end.

FIG. 3 shows the time domain multiplexing (TDM) alternative to the possible, but expensive, mechanization of physically cascading a plurality of filters (perhaps fourteen) end to end, each operating at half the frequency of the one before it (in decimation), or twice the frequency of the one before it (in interpolation). The filter takes the same, brief time to calculate its output regardless of whether it is operating at 16 megahertz or 792 hertz (792 hertz = 6 times the maximum signal frequency of 122 hertz). In 16 million cycles, therefore, 8 million cycles can be devoted to operating the filter at 8 megahertz, 4 million cycles can be devoted to operating the filter at 4 megahertz, 2 million cycles can be devoted to operating the filter at 2 megahertz, and so on all the way down to 792 hertz. There will always be a few cycles to spare, as indicated by the dotted line in the lower right corner of FIG. 3.

Figure 4:
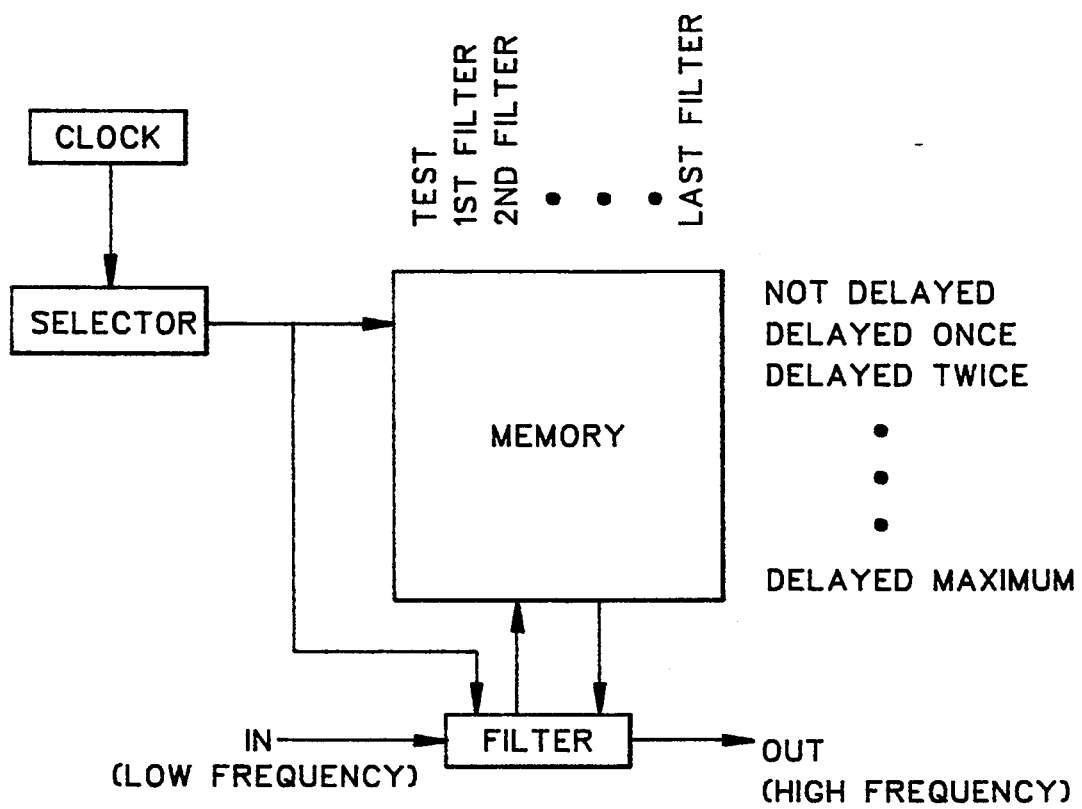
FIG. 4 shows how TDM may be mechanized.

FIG. 4 shows how TDM may be mechanized. When the filter is emulating the first filter of the cascade, it takes the input from the sigma-delta converter (decimation) or digital signal processor (interpolation) and stores its output in the first column of a memory. It uses these values, when emulating the second filter of the cascade, to compute outputs to be stored in a second column of the memory. This process continues until the filter emulates the last filter of the cascade, at which time it provides its output to the digital signal processor (decimation) or sigma-delta converter (interpolation). A plurality of registers may be used instead of a memory.

Figure 5:
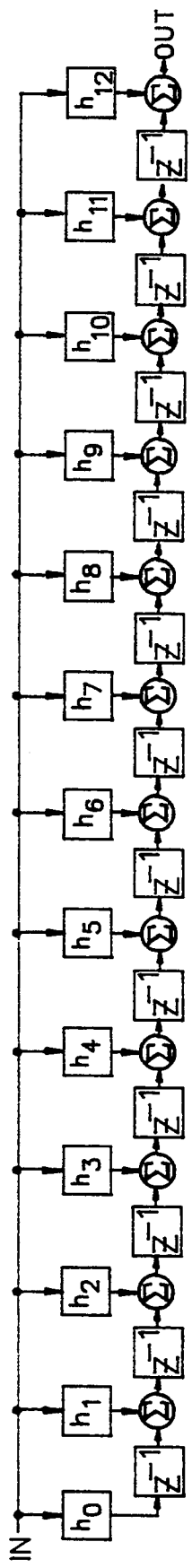
FIG. 5 shows an overview of a mechanization of the filter.

FIG. 5 shows an overview of a mechanization of the filter. An ordinary digital filter is shown, with thirteen taps, $h_0$ through $h_{12}$. It is significant that twelve is a multiple of four, as is shown below.

Figure 6:
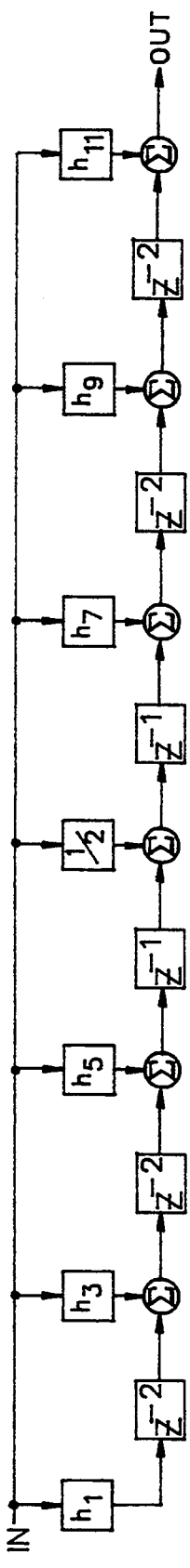
FIG. 6 shows that the tap weight of the center tap $h_6$ equals one half, and that the tap weights of the other even taps is zero.

FIG. 6 shows that the tap weight of the center tap $h_6$ equals one half, and that the tap weight of each of the other even taps is zero. This is done because the frequency response shown in FIG. 2 is the sum of (a) one half, and (b) an even function with an average value of zero. It is therefore best mechanized by providing two signal paths, the first for the half and the second for the even function. The half is mechanized by a center tap with a tap weight of one half. The even function is mechanized by an even number of equally spaced (in the time domain) taps, centered about a pair of middle taps, $h_5$ and $h_7$. The delay between the center tap $h_6$ and either of the middle taps $h_5$ and $h_7$ is half of the delay between any other pair of adjoining taps. The middle taps $h_5$ and $h_7$ have equal tap weights, as do successive taps proceeding outward from the middle taps $h_5$ and $h_7$.

More precisely, let N be a positive integer, and let the filter have $4N+1$ taps. In the example shown, $N=3$; Applicant has designed filters with N as high as 13. Let the tap weight of tap 2N equal one half, and let the tap weight of each of the other even taps equal zero. Let the tap weight of the odd taps be symmetrical about the center, i.e., let the tap weight of tap $2N-(2n-1)=$ the tap weight of symmetrical tap $2N+(2n-1)$, where n is an integer from 1 to N. The resulting filter has only $2N+1$ taps, and only N tap weights to be determined. FIG. 6 therefore shows $h_6=\frac{1}{2}$, and six other (odd numbered) non-zero taps. $h_6$ is the first signal path, and the other six taps form the second signal path.

Figure 7:
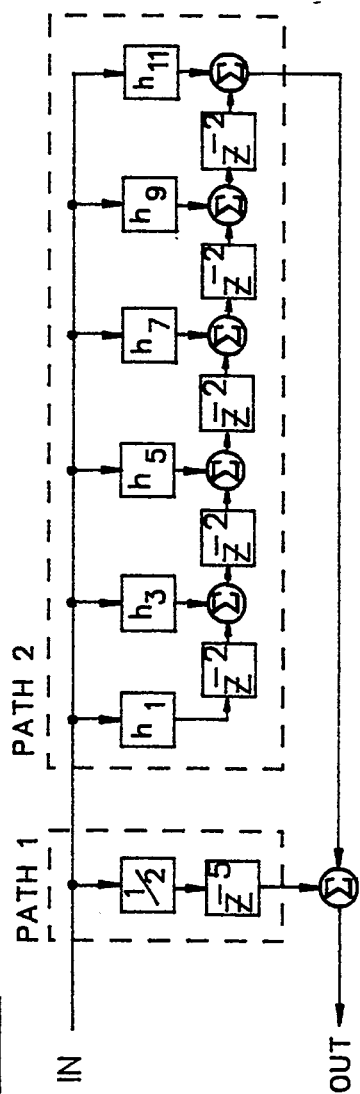
FIG. 7 is the same as FIG. 6, except that the two signal paths are explicitly separated.

FIG. 7 is the same as FIG. 6, except that the two signal paths are explicitly separated. Path one includes a delay element of $2N-1$ cycles. Since $N=3$ in the example shown, FIG. 7 shows this as a delay element $z^{-5}$. The outputs of path one and path two are summed to form the output of the filter as a whole.

It is therefore seen that the first signal path need have only a delay element, while the second signal path is more complex. The second signal path has an even number of taps, a first tap and an odd number of subsequent taps. The first tap need have only a multiplier. Each of the subsequent taps has a previous tap which partially drives it; and each subsequent tap has a multiplier, a delay element driven by the previous tap, and a summer driven by the multiplier and the delay element.

The taps of the second signal path include a pair of middle taps, each middle tap having a tap weight equal to the tap weight of the other middle tap. Each tap other than the middle taps has a tap symmetrical to it about the middle taps, and has a tap weight equal to the tap weight of its symmetrical tap. The sum of the delays of the second signal path is twice the delay of the first signal path, and the tap weights of the second signal path are selected to produce a half band low pass response.

Figure 8:
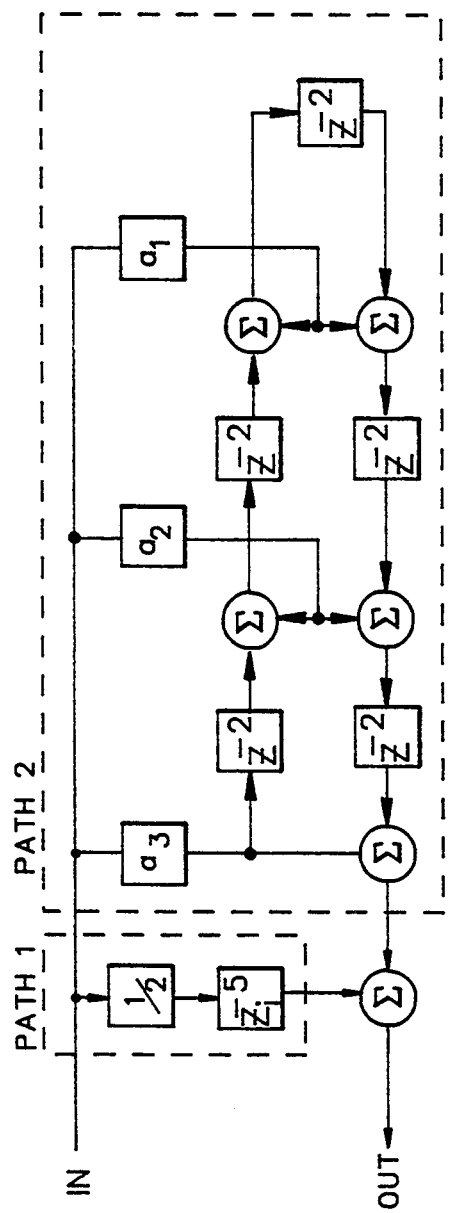
FIG. 8 shows a convenient mechanization for the requirement that tap $2N-(2n-1)$ have the same tap weight as tap $2N+(2n-1)$.

FIG. 8 shows a convenient mechanization for the requirement that tap $2N-(2n-1)$ have the same tap weight as tap $2N+(2n-1)$. Both taps are replaced by a tap $a_n$, where n goes from 1 to N, with the output going to the same summers as before. It is advantageous to mechanize this structure by multiplying each $a_n$ by two, omitting the divide-by-two element of path one, and inserting a divide-by-two element after the summer which recombines paths one and two; this enhances the signal-to-computational-noise ratio.

Figure 9:
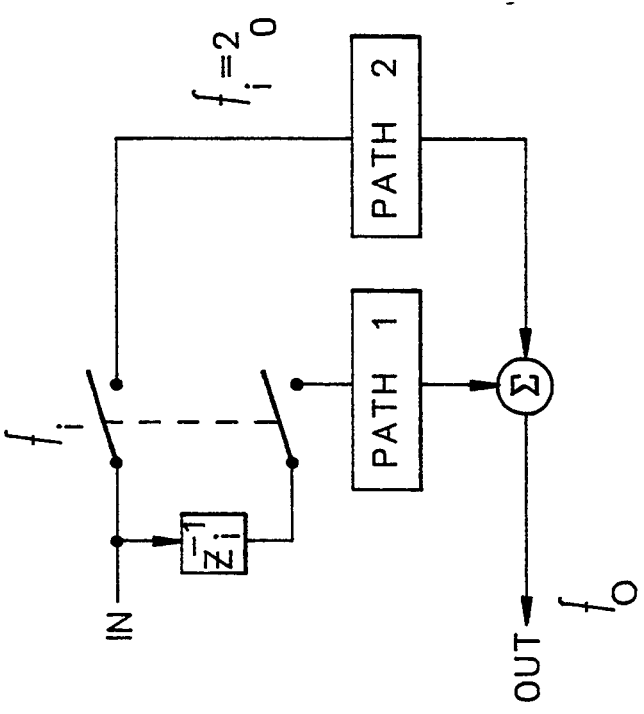
FIG. 9 shows an input sampler for the filter of FIG. 8, in a configuration appropriate for decimation.

FIG. 9 shows an exploitation of a design opportunity presented in FIG. 8, in a configuration appropriate for decimation. Whereas FIG. 6, upon which FIG. 8 is ultimately based, shows both one-cycle ($z^{-1}$) and two-cycle ($z^{-2}$) delays, path two of FIG. 8 shows only two-cycle delays. Further, although path one of FIG. 8 shows a delay of an odd number of cycles, this can be divided into a plurality of two-cycle delay in delays and a single one-cycle delay. The one-cycle delay in path one can be mechanized outside the filter as a single high-speed delay, as shown in FIG. 9, thereby leaving only two-cycle delays in the filter. All two-cycle delays in the filter can be mechanized as one-cycle low-speed delays, and the filter operated at its output frequency $f_o$, which is only half the input frequency $f_i$.

Decimation takes place by sampling before filtering, at the fast input frequency $f_i$. A first high-speed-to-low-speed sampler receives signals at the fast input frequency and produces sampled signals at the slow output frequency. This first sampler, which drives the first signal path, is preceded by a one-cycle delay element operating at the fast input frequency. A second high-speed-to-low-speed sampler drives the second signal path. Filter operation, in both signal paths, takes place at the slow output frequency $f_o$.

Figures 10, 11:
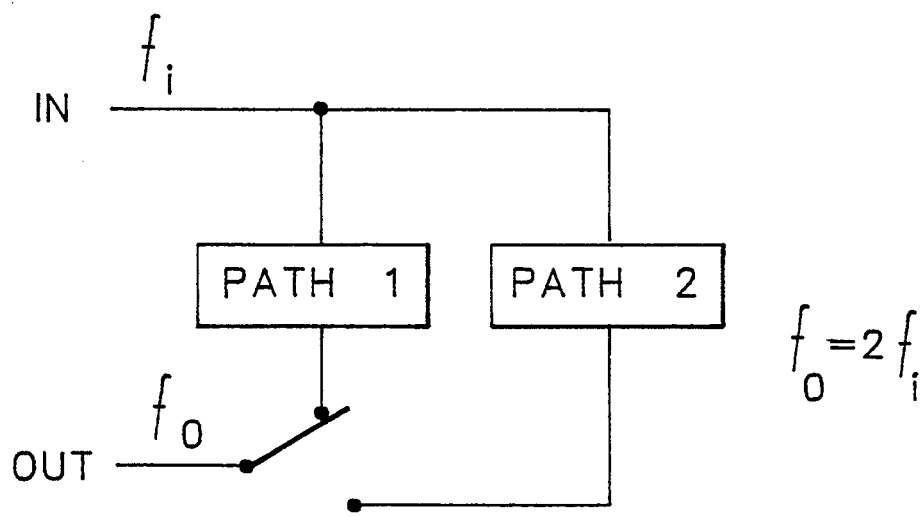
FIG. 10 is comparable to FIG. 9, but shows the sampler at the output, as is appropriate for interpolation.
FIG. 11 shows how the multipliers of FIG. 8 may be eliminated by a tree of adders according to a modification of the method of Bull and Horrocks.
Figure 12G:
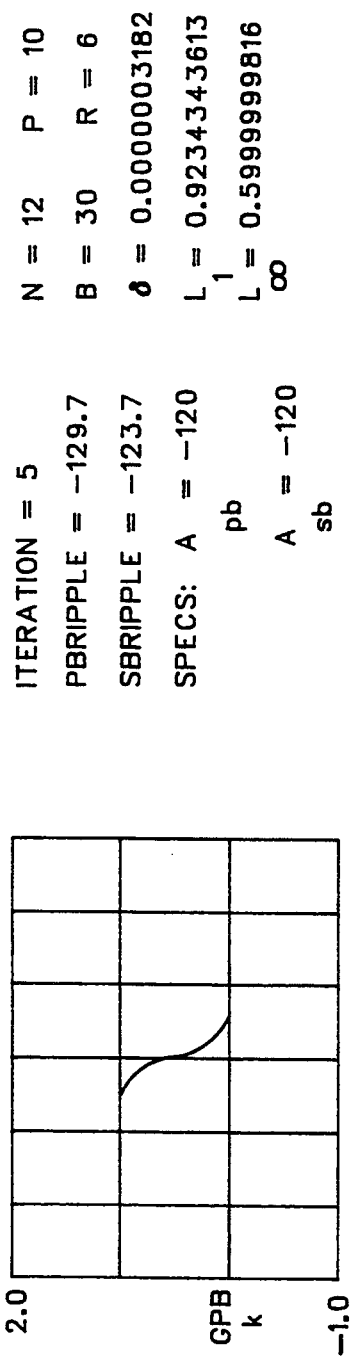
FIG. 12a-12e are a MATHCAD program which computes the number of taps in the filter and the weight of each tap; copyright 1992 Rockwell International Corporation.
Figure 12G:
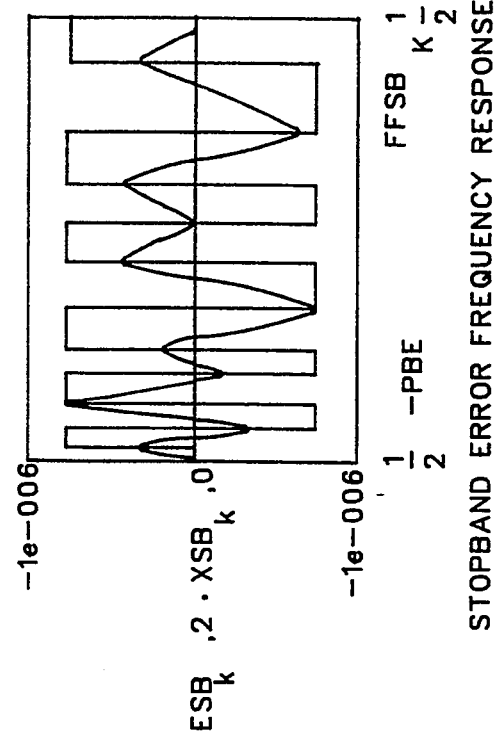
Figure 12G:
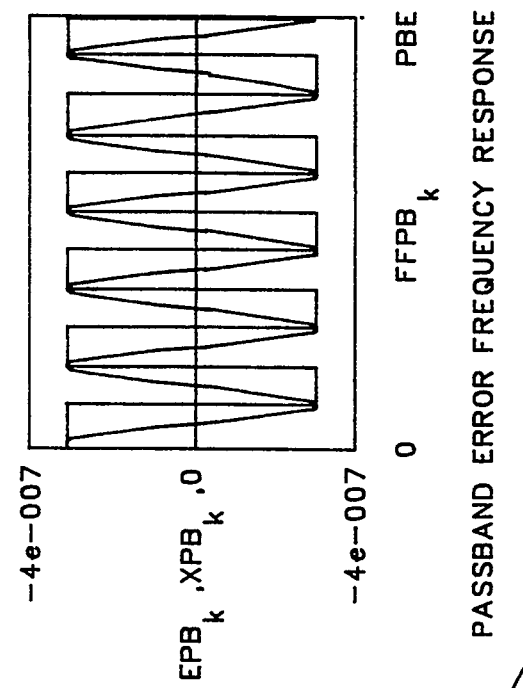
Figure 12J:
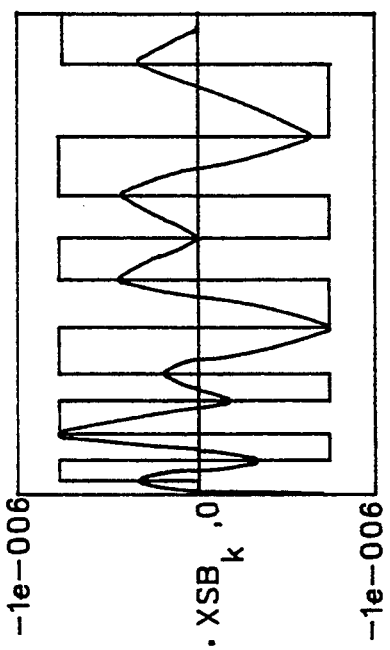
Figure 12J:
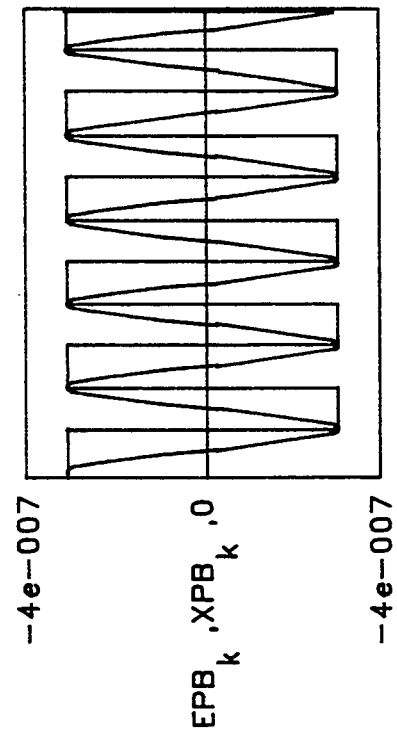

FIG. 10 is comparable to FIG. 9, but shows a low-speed-to-high-speed sampler at the output, as is appropriate for interpolation. Now the filter is allowed to calculate at the slow, input rate. The single output sampler acts as a selector alternating between the outputs of path one and path two. It receives signals at the slow input frequency and produces sampled signals at the fast output frequency. The sampler replaces the summer of FIG. 9. No high speed delay is required, as was required in decimation. It does no harm for the output from path one to be applied to the sampler when the toggle is sampling the output of path two, or vice versa. The only delay required is whatever repeated two-cycle delay is needed to place the output of path one in the center of the output of path two. This is conveniently mechanized as a plurality of low-speed delay elements, the same speed as the delay elements of path two.

FIG. 11 shows how the multipliers of FIG. 8 may be eliminated by a tree of adders according to a modification of the method of D. R. Bull and D. H. Horrocks, "Primitive Operator Digital Filter Synthesis Using a Shift Biased Algorithm," IEEE 1988 International Symposium of Circuits and Systems, New Orleans, La., page 1529, the disclosure of which is incorporated by reference. In FIG. 11, an exemplary multiplier coefficient in binary representation is converted to a canonical signed digit code (CSDC) representation. The purpose of this conversion is to maximize the number of zeroes in the representation. Each cluster of binary ones, with a leading zero and a trailing one, is replaced with a cluster of zeroes, with a leading one and a trailing minus one. Each cluster is called a primitive.

Suppose, for example, that an incoming digital signal is to be multiplied by a coefficient which includes the primitive 15 shown in FIG. 11. The portion of the multiplication affected by the primitive 15 requires only that the signal be shifted left four places, and then that the unshifted signal be subtracted from this shifted signal. This shift-followed-by-subtraction is much faster than a complete multiplication.

The conversion to CSDC representation need not be total. The 5 shown in FIG. 11 is retained as a binary number, since it is a power of two incremented by one. Yet it is treated as a primitive 5, and not separately as a 4 and a 1, since this primitive very probably appears in several other multiplier coefficients. The incoming data having been multiplied by a primitive (whether in CSDC or binary representation) even once, the product (which will always be in binary, not CSDC) may be stored and used many times. The final product may be calculated by shifting and summing the products of the incoming signal with the various primitives. No multiplication is involved; only shifting and varying (adding and subtracting) are present.

Primitives formed by varying (incrementing or decrementing) a power of two by one are called primary primitives. A primitive may also be formed by varying (incrementing or decrementing) a power of two by a primary primitive; these are called secondary primitives.

The incoming digital signal may be multiplied by a secondary primitive in a two step process. First, the signal is shifted appropriately. This multiplies the incoming signal by the power-of-two portion of the secondary primitive. Then, to this shifted signal, the (previously calculated) product of the incoming signal and a primary primitive is added or subtracted. This multiplies the incoming signal by the remaining portion of the secondary primitive.

The signal-times-primitive products, for both primary and secondary primitives, are now available for use in all of the multiplier coefficients. Each coefficient is constructed by selecting the appropriate primitives, shifting each primitive the appropriate amount, and adding. Multiplying the signal by the coefficient is therefore accomplished by selecting the appropriate signal-times-primitive products, shifting each product the appropriate amount, and adding. In FIG. 11, the product from 5 primitive is not shifted at all, while the product from the 7 primitive is shifted 5 places to the left and the product from the 15 primitive is shifted 11 places to the left.

It is possible to have tertiary or even higher order primitives, but this slows operation of the filter and is generally unnecessary. The adder tree preferably includes only the branches of the primary primitives and the twigs of the secondary primitives, without also including the leaves of tertiary or higher order primitives.

Each coefficient should be divided into the fewest possible primitives, since shifting and adding (or subtracting) a large number of signal-times-primitive-products is slower and more complex than similarly treating a small number. Further, the total number of primitives required to form all the coefficients should be minimized, since forming each primitive is also a slow and complex process. These goals are inconsistent, and the artisan must balance them to minimize the overall delay and complexity.

FIGS. 12$a$-12$e$ are a MATHCAD program which computes the number of taps in the filter and the weight of each tap; copyright 1992 Rockwell International Corporation. The mathematics underlying this program are discussed in Applicant's paper. "A Design Approach for a Decimation Filter," IEEE Asilomar Conference on Signals, Systems, and Computers, Monterey, Calif., 1992, the disclosure of which is incorporated by reference.

Figure 13:
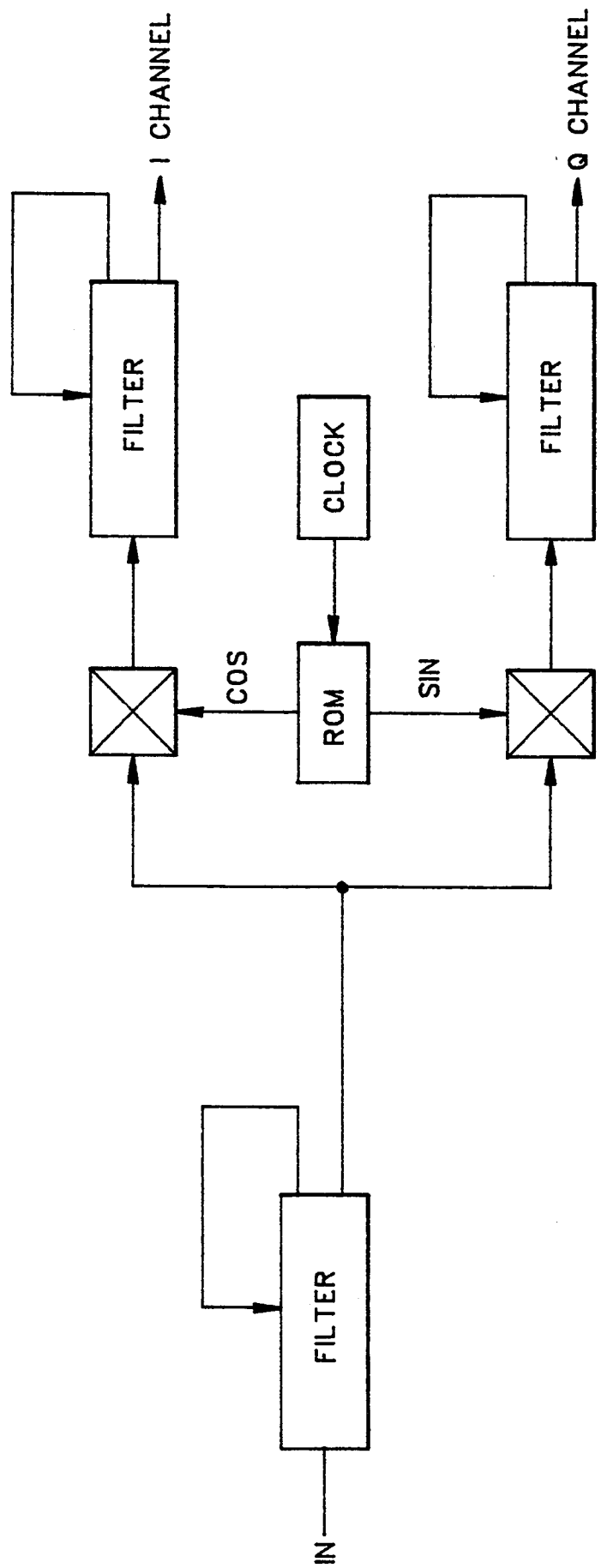
FIG. 13 shows how to convert a modulated signal.

FIG. 13 shows how to convert a modulated signal. If a low frequency analog signal (perhaps from $-122$ Hz to $+122$ Hz) rides on a higher frequency (perhaps 10 kilohertz) carrier, it will not do to sub-sample below the carrier frequency. Instead, when the sampling frequency has been reduced to four to eight times the carrier frequency (perhaps to 62.5 kilohertz), the partially filtered digital signal is demodulated, as described below. 62.5 kilohertz (the partially filtered sampling frequency) has the same ratio to 10 kilohertz (the carrier frequency) as 25 does to 4. Therefore, 25 samples are taken over 4 complete cycles of a stored sinusoid, and each incoming signal value is multiplied by the value of the next stored sinusoid sample. This process obviously modulates an unmodulated signal, but it also demodulates a modulated signal in the present invention. The product of two sinusoids of the same frequency, regardless of phase, is a sinusoid of twice that frequency. This higher frequency will not survive the next decimation to half the previous frequency.

25 samples is the minimum number needed. Having fewer samples results in imprecise demodulation, but having substantially more samples requires excessive storage and computation capacity. The original sampling frequency must therefore be selected so that, after the proper number of decimations, its ratio to the carrier frequency will be the ratio of two reasonably small (but not too small) integers.

The stored sinusoid may be replaced with a digital oscillator. This has the disadvantages of additional size, weight, and expense, but has the advantage that the sampling frequency and the carrier frequency are decoupled from each other. Indeed, the amplitude, phase, and frequency of the digital oscillator can be varied to match variations in the carrier, if these variations are known or can be determined. The final decision between a stored sinusoid and a digital oscillator is a design choice.

FIG. 13 shows two stored sinusoids in quadrature (one a cosine, the other a sine), each separately demodulating the partially filtered digital signal. This is desirable if the original analog signal included two sub-signals in quadrature, if noise is concentrated in one of the sub-signals, or the like. If each sub-signal is to be separately filtered thereafter, the filter must be operated at a slightly higher frequency (perhaps 9 megahertz) than the incoming data. The increase is slight, since the sub-signals are separately filtered at the lower frequencies (below 62.5 kilohertz, in this example), which puts only a modest additional burden on the time domain multiplexed filter.

The full step up to 9 megahertz is, strictly speaking, not necessary, since the separately filtered signals are of so much lower frequencies than the original sampling frequency; an increase by 129/128 would seem to do the job as well as the preferred increase by 9/8. However, the more modest increase in frequency has the disadvantage of being accompanied by 129 additional buffer registers per pass through the filter, rather than by 9. This would add to the expense and complexity which is sought to be avoided.

In the interpolation mode, the same pair of multiplications by stored sinusoids (or digital oscillator) may be used, again at the lower frequencies. In this situation, the lower frequencies occur during the first, rather than the last, passes through the filter. Modulation is delayed until the frequency has been raised to between four and eight times the carrier frequency, as before. The node of the decimation filter is replaced with a summer, a replacement which is easily mechanized with a mode switch.

INDUSTRIAL APPLICABILITY

The present invention is capable of exploitation in industry, and can be used, whenever inexpensive analog-to-digital, or digital-to-analog, conversion is desired. It can be made of components which, taken separately and apart from one another, are entirely conventional, or it can be made from their non-conventional counterparts.

While a particular embodiment has been shown in some detail, the true spirit and scope of the present invention are not limited thereto, but are limited only by the appended claims.

What is claimed is:

1. A decimation filter, comprising:
   (a) a first signal path consisting essentially of a high-speed delay element driving a high-speed-to-low-speed sampler driving at least one low speed delay element;
   (b) a second signal path consisting essentially of a high-speed-to-low-speed sampler driving an even number of taps, the taps including:
      (1) a first tap comprising a multiplier; and
      (2) an odd number of subsequent taps, each having a previous tap, and each comprising a multiplier, a low-speed delay element driven by the previous tap, and a summer driven by the multiplier and the delay element;
   the multiplier comprising means for simulating multiplication by shifting and varying an incoming signal according to primary primitives which are powers of two varied by one; the taps including a pair of middle taps, each middle tap having a tap weight equal to the tap weight of the other middle tap; each tap other than the middle taps having a tap symmetrical to it about the middle taps; each non-middle tap having a tap weight equal to the tap weight of its symmetrical tap; the sum of the delays of the second signal path being twice the delay of the first signal path; and the tap weights being selected to produce a half band low pass response;
   (c) means for summing outputs from the first and second signal paths; and
   (d) means for time domain multiplexing the summed outputs of the signal paths.

2. The filter according to claim 1, further comprising means for multiplying a summed output of the signal paths by a digitized sinusoid.

3. The filter according to claim 1, wherein the multipliers further comprise means for simulating multiplication by shifting and varying the incoming signal according to secondary primitives which are powers of two varied by a primary primitive.

4. The filter according to claim 3, further comprising means for multiplying a summed output of the signal paths by a digitized sinusoid.

5. An interpolation filter, comprising:
   (a) a first signal path consisting essentially of a delay element;
   (b) a second signal path consisting essentially of even number of taps, the taps including:
      (1) a first tap comprising a multiplier; and
      (2) an odd number of subsequent taps, each having a previous tap, and each comprising a multiplier, a low-speed delay element driven by the previous tap, and a summer driven by the multiplier and the delay element; the multipliers comprising means for simulating multiplication by shifting and varying an incoming signal according to primary primitives which are powers of two varied by one; the taps including a pair of middle taps, each middle tap having a tap weight equal to the tap weight of the other middle tap; each tap other than the middle taps having a tap symmetrical to it about the middle taps; each non-middle tap having a tap weight equal to the tap weight of its symmetrical tap; the sum of the delays of the second signal path being twice the delay of the first signal path; and the tap weights being selected to produce a half band low pass response;
   (c) a low-speed-to-high-speed sampler connected for alternately selecting outputs from the first and second signal paths; and
   (d) means for time domain multiplexing the selected outputs of the signal paths.

6. The filter according to claim 5, further comprising means for multiplying a summed output of the signal paths by a digitized sinusoid.

7. The filter according to claim 5, wherein the multipliers further comprise means for simulating multiplication by shifting and varying the incoming signal according to secondary primitives which are powers of two varied by a primary primitive.

8. The filter according to claim 7, further comprising means for multiplying a summed output of the signal paths by a digitized sinusoid.

* * * * *